(12) United States Patent
Ha

(10) Patent No.: US 10,186,536 B2
(45) Date of Patent: Jan. 22, 2019

(54) IMAGE SENSOR

(71) Applicant: Man Lyun Ha, Mungyeong-si (KR)

(72) Inventor: Man Lyun Ha, Mungyeong-si (KR)

(73) Assignee: DB Hitek Co., Ltd., Seoul (KR)

( * ) Notice: Subject to any disclaimer, the term of this patent is extended or adjusted under 35 U.S.C. 154(b) by 0 days.

(21) Appl. No.: 15/283,156

(22) Filed: Sep. 30, 2016

(65) Prior Publication Data

US 2017/0194372 A1    Jul. 6, 2017

(30) Foreign Application Priority Data

Jan. 4, 2016    (KR) .................. 10-2016-0000270

(51) Int. Cl.
| | |
|---|---|
| H01L 27/14 | (2006.01) |
| H01L 27/146 | (2006.01) |
| H04N 5/357 | (2011.01) |
| H04N 5/378 | (2011.01) |

(52) U.S. Cl.
CPC .... H01L 27/14614 (2013.01); H01L 27/1463 (2013.01); H01L 27/14643 (2013.01); H04N 5/3575 (2013.01); H04N 5/378 (2013.01)

(58) Field of Classification Search
CPC ................ H01L 27/14614; H01L 27/1463
See application file for complete search history.

(56) References Cited

U.S. PATENT DOCUMENTS

| | | | | |
|---|---|---|---|---|
| 6,670,990 B1* | 12/2003 | Kochi | ............... | H01L 27/14609 348/310 |
| 7,592,579 B2* | 9/2009 | Tamura | ............. | H01L 27/14603 250/208.1 |
| 7,601,999 B2* | 10/2009 | Barna | .................. | H01L 27/146 257/291 |
| 7,829,832 B2* | 11/2010 | Mauritzson | ....... | H01L 27/14609 250/208.1 |

(Continued)

FOREIGN PATENT DOCUMENTS

| | | |
|---|---|---|
| JP | 2008124229 A | 5/2008 |
| JP | 2008186894 A | 8/2008 |

(Continued)

OTHER PUBLICATIONS

Office Action dated May 3, 2016; Korean Patent Application No. 10-2016-0000270; 9 pgs.; Korean Intellectual Property Office, Republic of Korea.

(Continued)

*Primary Examiner* — Caridad Everhart
*Assistant Examiner* — Ankush Singal
(74) *Attorney, Agent, or Firm* — Andrew D. Fortney; Central California IP Group, P.C.

(57) ABSTRACT

An image sensor is disclosed. The image sensor includes a pixel array including a plurality of pixel units, a controller configured to drive the pixel array, and an analog-digital conversion block configured to convert a sensing signal output from the pixel array to a digital signal, wherein each of the pixel units includes a photodiode and a plurality of (Continued)

transistors on a semiconductor substrate, each of the transistors includes a gate electrode and a gate dielectric layer, each gate dielectric having a thickness, and the thickness of at least one of the gate dielectric layers is different from the thickness of at least one of the other gate dielectric layers.

11 Claims, 5 Drawing Sheets

(56) References Cited

U.S. PATENT DOCUMENTS

| | | | |
|---|---|---|---|
| 8,525,909 B2 | 9/2013 | Matsumoto et al. | |
| 8,953,077 B2 | 2/2015 | Matsumoto et al. | |
| 9,165,975 B2 | 10/2015 | Matsumoto et al. | |
| 9,397,136 B2 | 7/2016 | Matsumoto et al. | |
| 9,583,528 B2* | 2/2017 | Takagi | H01L 27/14603 |
| 2005/0145901 A1* | 7/2005 | Gyun | H01L 27/14603 257/290 |
| 2006/0249731 A1* | 11/2006 | Ladd | H04N 5/3591 257/59 |
| 2006/0250511 A1* | 11/2006 | Lyu | H01L 27/14609 348/294 |
| 2007/0045681 A1* | 3/2007 | Mauritzson | H01L 27/14609 257/292 |
| 2009/0316034 A1* | 12/2009 | Kusuda | H04N 5/374 348/308 |
| 2010/0026866 A1 | 2/2010 | Matsumoto et al. | |
| 2010/0140675 A1* | 6/2010 | Rhodes | H01L 27/14601 257/292 |
| 2010/0207204 A1* | 8/2010 | Kim | H01L 21/823456 257/330 |
| 2011/0177646 A1* | 7/2011 | Hynecek | H01L 27/1463 438/70 |
| 2011/0187911 A1* | 8/2011 | Shinohara | H01L 27/14812 348/308 |
| 2012/0140089 A1* | 6/2012 | Koh | H04N 5/23245 348/220.1 |
| 2012/0181589 A1* | 7/2012 | Zhu | H01L 27/14612 257/292 |
| 2012/0211642 A1* | 8/2012 | Iwamoto | H04N 5/35509 250/208.1 |
| 2012/0313205 A1* | 12/2012 | Haddad | H01L 31/02363 257/432 |
| 2013/0037890 A1* | 2/2013 | Tseng | H01L 27/14614 257/411 |
| 2013/0134520 A1* | 5/2013 | Maeda | H01L 21/823418 257/368 |
| 2013/0285131 A1 | 10/2013 | Matsumoto et al. | |
| 2014/0103412 A1* | 4/2014 | Lee | H01L 27/14605 257/292 |
| 2014/0117204 A1* | 5/2014 | Ha | H04N 5/3559 250/208.1 |
| 2014/0197509 A1* | 7/2014 | Haddad | H01L 27/14629 257/432 |
| 2014/0232890 A1* | 8/2014 | Yoo | H04N 5/23245 348/220.1 |
| 2015/0115341 A1 | 4/2015 | Matsumoto et al. | |
| 2015/0189207 A1* | 7/2015 | Chien | H04N 5/374 348/308 |
| 2015/0380456 A1 | 12/2015 | Matsumoto et al. | |
| 2016/0013227 A1* | 1/2016 | Kim | H01L 27/14612 257/229 |
| 2016/0088243 A1* | 3/2016 | Higashi | H01L 27/14612 348/294 |
| 2016/0190198 A1* | 6/2016 | Kwon | H01L 27/14634 257/435 |
| 2016/0276392 A1 | 9/2016 | Matsumoto et al. | |

FOREIGN PATENT DOCUMENTS

| | | |
|---|---|---|
| JP | 2010056515 A | 3/2010 |
| JP | 4798320 B2 | 10/2011 |

OTHER PUBLICATIONS

"Solid State Imaging Device"; Bibliographic Data of JP4798320 (B2); Oct. 19, 2011; Japanese Patent Office, Tokyo, Japan; http://worldwide.espacenet.com.

Matsumoto Takuji et al.; "Solid State Imaging Device, Method for Manufacturing the same, and Imaging Apparatus"; Bibliographic Data of JP2010056515 (A); Mar. 11, 2010; 2 pgs.; Japanese Patent Office, Tokyo, Japan; http://worldwide.espacenet.com.

Endo Yasuyuki et al.; "Solid-State Image Sensor"; Bibliographic Data of JP2008186894 (A); Aug. 14, 2008; 2 pgs.; Japanese Patent Office, Tokyo, Japan; http://worldwide.espacenet.com.

Endo Yasuyuki et al.; "Solid-State Imaging Element"; Bibliographic Data of JP2008124229 (A); May 29, 2008; 2 pgs.; Japanese Patent Office, Tokyo, Japan; http://worldwide.espacenet.com.

* cited by examiner

IMAGE SENSOR

CROSS REFERENCE TO RELATED APPLICATION

This application claims the benefit of Korean Patent Application No. 10-2016-0000270, filed on Jan. 4, 2016, which is hereby incorporated by reference as if fully set forth herein.

BACKGROUND OF THE INVENTION

Field of the Invention

The present invention relates to an image sensor.

Discussion of the Related Art

An image sensor is a semiconductor device that converts an optical image into an electrical signal. A charge coupled device (CCD) image sensor and a complementary metal oxide semiconductor (CMOS) image sensor are representative image sensors.

In general, the CMOS image sensor may be divided into a 3T type, a 4T type, or a 5T type image sensor according to the number of transistors. The number of transistors in the type constitutes a pixel unit. The pixel unit may include a least one transistor (e.g., a transfer transistor [TX], a reset transistor [RX], a select transistor [SX], and/or drive transistor) according to the type of pixel unit.

SUMMARY OF THE INVENTION

Accordingly, the present invention is directed to an image sensor that substantially obviates one or more problems due to limitations and disadvantages of the related art.

An object of the present invention is to provide an image sensor capable of minimizing a proportion or quantity of blinking pixels, time-variant noise, and/or power consumption.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structures particularly pointed out in the written description and claims hereof as well as the appended drawings.

To achieve these objects and other advantages and in accordance with the purpose(s) of the invention, as embodied and broadly described herein, an image sensor may include a pixel array comprising a plurality of pixel units, a controller configured to drive the pixel array, and an analog-digital conversion block configured to convert a sensing signal from the pixel array into a digital signal, wherein each of the pixel units includes a photodiode and a plurality of transistors on or over a semiconductor substrate, each of the transistors includes a gate electrode and a gate dielectric layer, each gate dielectric layer having a thickness, and the thickness of at least one of the gate dielectric layers is different from the thickness of at least one of the other gate dielectric layers.

The thickness of at least one of the gate dielectric layers may be less than the thicknesses of the other gate dielectric layers.

At least one of the other gate dielectric layers may have a thickness different from another one of the other gate dielectric layers.

The thickness of at least one of the gate dielectric layers may be less than at least another one of the other gate dielectric layers, and is equal to another one of the other gate dielectric layers.

A thickness of at least one of the gate dielectric layers may be less than at least one of the other gate dielectric layers, and may be greater than another one of the other gate dielectric layers.

In accordance with another aspect of the present invention, an image sensor may include a pixel array including a plurality of pixel units, a controller configured to drive the pixel array, and an analog-digital conversion block configured to convert a sensing signal from the pixel array into a digital signal, wherein each of the pixel units includes a photodiode in a semiconductor substrate and a transfer transistor, a reset transistor, a drive transistor, and a select transistor on and/or in the semiconductor substrate and spaced from one another, and the transfer transistor includes a first gate electrode and a first gate dielectric layer, the reset transistor includes a second gate electrode and a second gate dielectric layer, the drive transistor includes a third gate electrode and a third gate dielectric layer, the select transistor includes a fourth gate electrode and a fourth gate dielectric layer, and a thickness of at least one of the first, second, third or fourth gate dielectric layers is different from that of the other gate dielectric layers.

The third gate dielectric layer may have a thickness less than a thickness of the first gate dielectric layer, the second gate dielectric layer, or the fourth gate dielectric layer.

The thickness of the third gate dielectric layer may be less than the thickness of the first gate dielectric layer, the thickness of the second gate dielectric layer, and the thickness of the fourth gate dielectric layer.

The thickness of the third gate dielectric layer may be equal to a thickness of one of the first gate dielectric layer, the second gate dielectric layer, and the fourth gate dielectric layer.

The thickness of at least one of the first gate dielectric layer, the second gate dielectric layer, and the fourth gate dielectric layer may be less than the thicknesses of the others of the first, second, and fourth gate dielectric layers.

The thickness of the second gate dielectric layer may be less than the thickness of the first gate dielectric layer and the thickness of the fourth gate dielectric layer.

The thickness of the first gate dielectric layer and the thickness of the fourth gate dielectric layer may be identical to each other.

The thickness of the first gate dielectric layer may identical to the thickness of the third gate dielectric layer.

The first gate dielectric layer may be between the semiconductor substrate and the first gate electrode, the second gate dielectric layer may be between the semiconductor substrate and the second gate electrode, the third gate dielectric layer may be between the semiconductor substrate and the third gate electrode, and the fourth gate dielectric layer may be between the semiconductor substrate and the fourth gate electrode.

The first, second, third, and fourth gate dielectric layers may be on the semiconductor substrate spaced apart from one other.

The thickness of the third gate dielectric layer may be greater than or equal to 1 nm and less than 6 nm, and each of the thicknesses of the first gate dielectric layer, the second gate dielectric layer, and the fourth gate dielectric layer may be greater than or equal to 6 nm and less than or equal to 10 nm.

In accordance with another aspect of the present invention, an image sensor may include a sensing area including a pixel array including a plurality of pixel units, a digital area configured to control the sensing area, and an analog area configured to convert a signal from the sensing area into a digital signal, wherein each of the pixel units includes a photodiode, a transfer transistor, a reset transistor, a drive transistor, and a select transistor, each of the transfer transistor, the reset transistor, the drive transistor, and the select transistor includes a gate dielectric having an independent thickness, the thickness of at least one of the gate dielectric layers of the transfer transistor, the reset transistor, the drive transistor, and the select transistor is different from the thickness of the at least one other gate dielectric layer of the transfer transistor, the reset transistor, the drive transistor, and the select transistor, the digital area includes at least one first transistor, the analog area includes at least one second transistor, each of the first and second transistors include a gate dielectric layer having a thickness, and each of the thicknesses of the gate dielectric layers of the transfer transistor, the reset transistor, the drive transistor, and the select transistor is less than the thicknesses of the gate dielectric layers of the first and second transistors.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
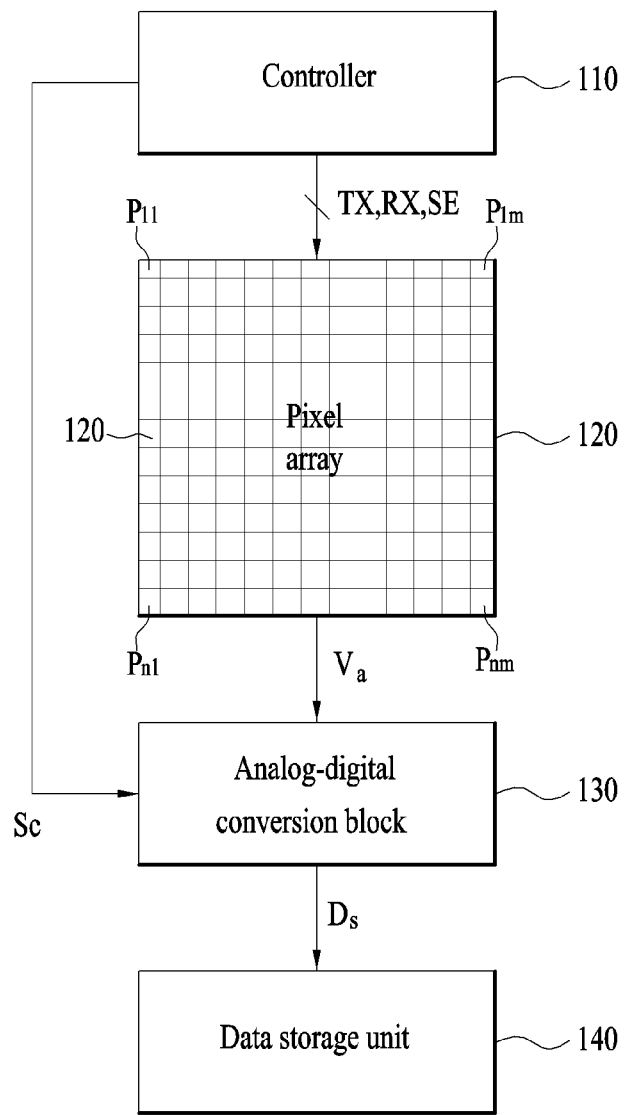
FIG. 1 is a block diagram illustrating an exemplary image sensor according to one or more embodiments of the present invention.

Hereinafter, exemplary embodiments of the present invention will be described in detail with reference to the accompanying drawings.

In the following description of the embodiments, it will be understood that, when a layer, film, region, pattern or structure is referred to as being "on" or "under" a substrate or another layer, film, region, pad or pattern, it can be directly or indirectly on the other layer, film, region, pattern or structure, or one or more intervening layers, films, regions, patterns and structures may also be present. Such a position of each layer described with reference to the drawings. The same reference numerals used throughout the specification refer to the same constituent elements.

Figure 2:
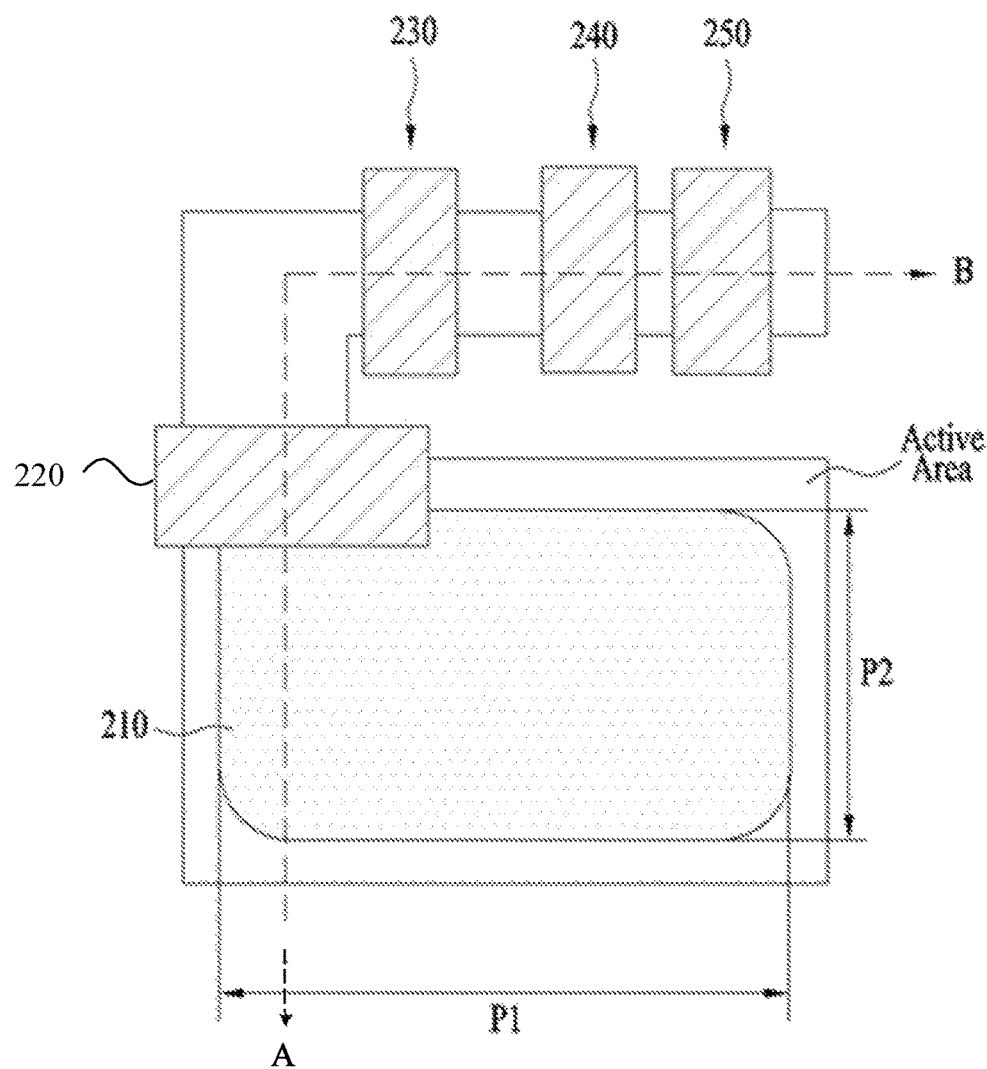
FIG. 2 is a layout illustrating an exemplary pixel unit as illustrated in FIG. 1.
Figure 3:
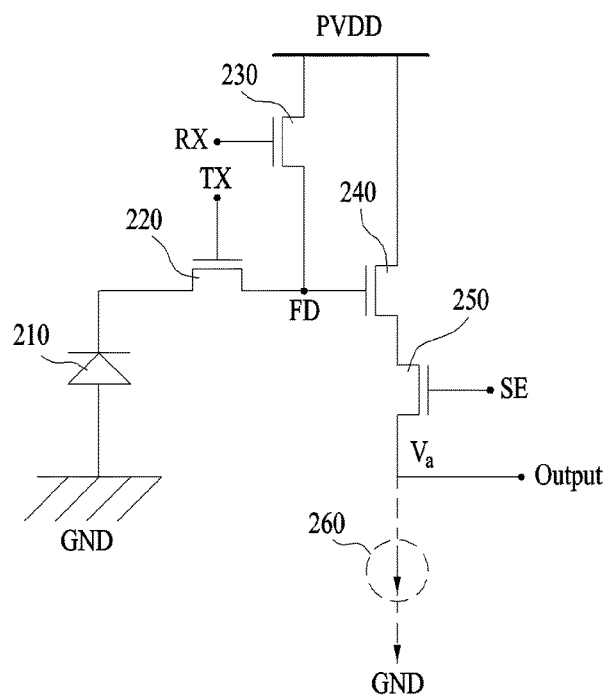
FIG. 3 is a circuit diagram illustrating the exemplary pixel unit illustrated in FIG. 2.

FIG. 1 is a block diagram illustrating an exemplary image sensor according to one or more embodiments of the present invention. FIG. 2 is a layout illustrating an exemplary pixel unit as illustrated in FIG. 1. FIG. 3 is a circuit diagram illustrating the exemplary pixel unit illustrated in FIG. 2.

An Exemplary Digital Conversion Block

Referring to FIGS. 1 to 3, the image sensor, which is designated by reference numeral "100" according to the present invention, includes a controller 110, a pixel array 120, and an analog-digital conversion block 130.

The controller 110 outputs control signals (e.g., a reset signal RX, a transfer signal TX, and a select signal SX) for controlling the pixel array 120 and control signals (Sc) for controlling the analog-digital conversion block 130.

An Exemplary Pixel Unit

The pixel array 120 includes a plurality of pixel units P11 to Pnm (n and m being natural numbers). The pixel units P11 to Pnm may be arranged in a matrix of rows and columns. Each of the pixel units P11 to Pnm may comprise a photoelectric conversion device that senses light and converts the light into an electrical signal.

The pixel array 120 may include sensing lines that are connected to output terminals of the pixel units P11 to Pnm, respectively.

Each of the pixel units P11 to Pnm may include a photodiode 210 and first, second, third, and fourth transistors 220, 230, 240 and 250, as shown in FIG. 2. The pixel units P11 to Pnm may be identical in shape to one another.

For example, the first transistor 220 may be a transfer transistor, the second transistor 230 may be a reset transistor, the third transistor 240 may be a drive transistor, and the fourth transistor 250 may be a select transistor. Each of the pixel units P11 to Pnm may further include a current source 260, as shown in FIG. 3.

Referring to FIG. 3, the photodiode 210 may be connected between a first power source GND and the transfer transistor 220 to absorb light and to generate charges using absorbed light. The first power source GND may be a ground voltage or a ground potential.

The transfer transistor 220 may be connected between a sensing node FD and the photodiode 210. In general, the transfer transistor 220 may be controlled by the transfer signal TX from the controller 110 (FIG. 1). The transfer transistor 220 may transfer the charges generated by the photodiode 210 to the sensing node FD in response to the transfer signal TX. Herein, the sensing node FD may be a floating diffusion region.

The reset transistor 230 may be connected between a second power source PVDD and the sensing node FD. The reset transistor 230 may be controlled by the reset signal RX from the controller 110. The second power source PVDD may be a full-rail voltage or power supply (e.g., 3.3 V, 3 V, 2.5 V, 1.8 V, 1.5 V, etc.). The transistor 230 may reset the pixel units P11 to Pnm in response to the reset signal RX.

The drive transistor 240 may be connected between the second power source PVDD and a terminal (e.g., a source or a drain) of the select transistor 250. A gate of the drive transistor 240 may be connected to the sensing node FD. The drive transistor 240 may be controlled in response to a voltage on the sensing node FD. The drive transistor 240 and the current source 260 may constitute a source follower and may function as a buffer.

The select transistor 250 may be connected between the drive transistor 240 and the current source 260. The select transistor 250 may be controlled by the select signal SE from the controller 110 and may output a sensing signal Va to an output terminal. Herein, the output terminal may be an access node between the select transistor 250 and the current source 260. The sensing signal Va may be a signal output at the output terminal according to the amount of charge sensed on or from the photodiode 210. The current source 260 may be connected between the select transistor 250 and the first power source GND.

The analog-digital conversion block 130 samples the sensing signal Va (e.g., an analog signal) output from the pixel array 120 and converts the sampled sensing signal Va into a digital signal Dc.

The analog-digital conversion block 130 may perform correlated double sampling (CDS) to remove fixed pattern noise from the pixel.

Correlated double sampling may refer to the calculation of a difference (e.g., Dsig-Drst) between a first digital data signal or value Drst and a second digital data signal or value Dsig. Generally, a first sensing signal Vret output from the pixel unit upon reset of the pixel unit is converted to the first digital data signal or value Drst, and a second sensing signal Vsig output from the pixel unit corresponding to an external image signal is converted to the second digital data signal or value Dsig.

For example, the analog-digital conversion block 130 may include a CDS processor that performs correlated double sampling, and an analog-digital converter that converts an output of the CDS processor into the digital signal Ds.

For example, the CDS processor may include a switch, a capacitor, and a differential amplifier. However, embodiments are not limited thereto, and various types of processors may be implemented.

For example, the analog-digital conversion block 130 may include a ramp signal generator, a comparator, and a counter. However, embodiments are not limited thereto, and may be implemented as any of various types of analog-to-digital converters.

The image sensor 100 may further include a data storage unit 140, such as a latch unit, for storing the digital signal Ds output from the analog-digital conversion block 130.

The controller 110 may include a timing controller that generates a timing signal and a driver that provides the driving signals TX, RX, and SE that drive the transistors in the pixel units of the pixel array 120. In addition, the controller 110 may include an input/output unit that controls the signals input to and/or output from the timing controller and the driver, and from the timing controller to the analog-digital conversion block 130.

Figure 4:
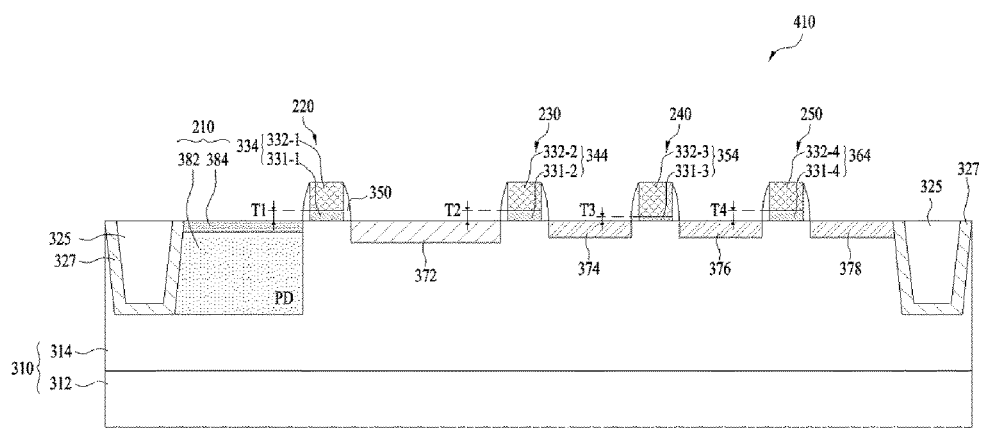
FIG. 4 is a cross-sectional view illustrating the exemplary pixel unit illustrated in FIG. 2, taken along a line A-B, according to one or more embodiments of the present invention.

FIG. 4 is a cross-sectional view illustrating the exemplary pixel unit illustrated in FIG. 2, taken along line A-B, according to one or more embodiments of the present invention.

Referring to FIG. 4, the pixel unit 410 may include a semiconductor substrate 310, a device isolation layer 325, a photodiode 210, first, second, third, and fourth gates 334, 344, 354, and 364, first, second, third, and fourth gate dielectric layers 331-1 to 331-4, spacers 350, and first, second, third and fourth impurity regions 372, 374, 376 and 378.

For example, the semiconductor substrate 310 may include a silicon substrate 312 and an epitaxial layer (e.g., epi-layer) 314. The silicon substrate 312 may include a single-crystal or polycrystalline semiconductor (e.g., silicon) having a high concentration of a first conductive type impurity (e.g., P++), and the epi-layer 314 may have a low concentration of the first conductive type impurity (e.g., P−). The epi-layer 314 may be formed on the semiconductor substrate 310 by an epitaxial process. However, embodiments are not limited thereto.

For example, the concentration of p-type impurity injected into the epi-layer 314 may be less than the concentration of p-type impurity injected or otherwise introduced into the silicon substrate 312, but embodiments are not limited thereto. A depleted region of the photodiode 210 may be relatively wide and deep due to the epi-layer 314 having a low concentration of the first conductive type impurity. As a result, the ability and photosensitivity of the low-voltage photodiode for collecting photo charges may be relatively high.

The device isolation layer 325 may be in the semiconductor substrate 310 and define an active region and a device isolation region 325. Alternatively, the device isolation layer 325 may be in the epi-layer 314. The device isolation layer 325 may be formed in either case by a shallow trench isolation process or a local oxidation of silicon (LOCOS) process.

The first, second, third and fourth gates 334, 344, 354, and 364 may be on an upper surface of the semiconductor substrate 310 and may be spaced from one another.

The first gate 334 may be a transfer transistor gate, the second gate 344 may be a reset transistor gate, the third gate 334 may be a drive transistor gate, and the fourth gate 364 may be a select transistor gate.

The spacers 350 may be on sidewalls of each of the first, second, third and fourth gates 334, 344, 354, and 364, respectively.

The first, second, third and fourth gates 334, 344, 354, and 364 may include the gate dielectric layers 331-1-331-4 and gate electrodes 332-1 to 332-4, respectively.

For example, the first gate 334 may be on the upper surface of the semiconductor substrate 310. The first gate 334 may include the first gate electrode 332-1, to which the transfer signal TX is applied, and the first dielectric layer 331-1 may be between the first gate electrode 332-1 and the upper surface of the semiconductor substrate 310.

Furthermore, the second gate 344 may be on the upper surface of the semiconductor substrate 310. The second gate 344 may include the second gate electrode 332-2 to which the reset signal RX is applied, and the second dielectric layer 331-2 may be between the second gate electrode 332-2 and the upper surface of the semiconductor substrate 310.

Furthermore, the third gate 354 may include the third gate electrode 332-3 on the upper surface of the semiconductor substrate 310 and the third dielectric layer 331-3 may be between the third gate electrode 332-3 and the upper surface of the semiconductor substrate 310.

Furthermore, the fourth gate 364 may be on the upper surface of the semiconductor substrate 310. The fourth gate 364 may include the fourth gate electrode 332-4 to which the select signal RX is applied, and the fourth dielectric layer 331-4 may be between the fourth gate electrode 332-4 and the upper surface of the semiconductor substrate 310.

The gate dielectric layers 331-1 to 331-4 and the gate electrodes 332-1 to 332-4 may be formed in sequence on the semiconductor substrate 110. Each of the first to fourth gate dielectric layers 331-1 to 331-4 may comprise an oxide layer and/or a nitride layer. Each of the first to fourth gate dielectric layers 331-1 to 331-4 may be a single layer or may include multiple layers. Each of the first to fourth gate electrodes 332-1 to 332-4 may include polysilicon and optionally a metal silicide, but embodiments are not limited thereto.

The photodiode 210 of the pixel unit 410 may be in a light receiving region P1×P2 (see, e.g., FIG. 2) of the semiconductor substrate 310 between the device isolation layer 325 and the first gate 334. One end of the photodiode 210 may be in contact with one end of the first gate 334 or the spacer of the first gate 334. The light receiving region P1×P2 may be the active region of the semiconductor substrate 110 that forms a photodiode 210 for sensing light.

The photodiode 210 may be or comprise a region where impurities are injected into the active region of the semiconductor substrate 310 in the light receiving region P1×P2. The photodiode 210 may include a first region 382 having a second conductive type impurity and a second region 384 having the first conductive type impurity, which are sequentially formed in the semiconductor substrate 310 in a vertical direction. Herein, the vertical direction may be a direction along the shortest line from within the semiconductor substrate 310 to within the epi-layer 314. Thus, the lowermost edge or border of the second region 304 may be above the lowermost edge or border of the first region 382.

The first region 382 may be a region where the second conductive type impurity (e.g., an n-type impurity) is injected into the semiconductor substrate 310 at a first energy. The first region 382 and the p-type semiconductor substrate 310 may form a pn-junction.

The second region 384 may be formed in the first region 382, generally at a lower energy than the first region. A lower surface of the second region 384 may be above a lower surface of the first region 382. One side of the second region 384 may be in contact with the first gate 334 or the spacer of the first gate 334.

The second region 384 may be a region into which a high concentration of first conductive type (e.g., p+ type) impurities are injected. The second region 384 may prevent generation of dangling bonds in or on the photodiode 210 and prevent dark current from flowing along an upper surface of the photodiode 210. Alternatively, the second region 384 may be omitted.

An impurity region 327 may be in the semiconductor substrate 310 surrounding an outer circumferential surface of the device isolation layer 325. Thereby, current leakage flowing along the device isolation layer 325 from the second region 384 may be reduced or prevented, and crosstalk between adjacent pixel units may be reduced or prevented.

A first impurity region 372 may be in the semiconductor substrate 310 between the first gate 334 and the second gate 344. The first impurity region 372 may include a region where the second conductive type impurity is injected into the semiconductor substrate 310. The first impurity region 372 may include the diffusion region illustrated in FIGS. 2 and 3.

A second impurity region 374 may be in the semiconductor substrate 310 between the second gate 344 and the third gate 354. The third impurity region 376 may be in the semiconductor substrate 310 between the third gate 354 and the fourth gate 364. The fourth impurity region 378 may be between the fourth gate 364 and the device isolation layer 325. The second, third and fourth impurity regions 374, 376, and 378 may function as a source and/or drain for one or more of the reset transistor 230, the drive transistor 240 and the select transistor 250.

At least one of the first, second, third and fourth dielectric layers 331-1 to 331-4 of the pixel unit 410 may have a thickness different from the other dielectric layers 331-1 to 331-4.

For example, a thickness T3 of the third gate dielectric layer 331-3 of the drive transistor 240 may be less than a thickness T1 of the first gate dielectric layer 331-1 of the transfer transistor 220, a thickness T2 of the second gate dielectric layer 331-2 of the reset transistor 230, and a thickness T4 of the fourth gate dielectric layer 331-4 of the select transistor 250 (e.g., T3<T1, T2, and T4).

Furthermore, the thickness T1 of the first gate dielectric layer 331-1 of the transfer transistor 220, the thickness T2 of the second gate dielectric layer 331-2 of the reset transistor 230, and the thickness T4 of the fourth gate dielectric layer 331-4 of the select transistor 250 may be identical to one another.

The thickness T3 of the third gate dielectric layer 331-3 may be greater than or equal to 1 nm and less than 6 nm (e.g., 1 nm≤T3<6 nm).

In addition, according to one or more further embodiments, the thickness T3 of the third gate dielectric layer 331-3 may be greater than or equal to 3 nm and less than or equal to 4 nm (e.g., 3 nm≤T3≤4 nm).

Alternatively, according to one or more further embodiments, the thickness T3 of the third gate dielectric layer 331-3 may be greater than or equal to 1 nm and less than or equal to 3 nm (e.g., 1 nm≤T3≤3 nm).

T1, T2 and T4 may be greater than or equal to 6 nm and less than or equal to 10 nm (e.g., 6 nm≤T1, T2, and T4≤10 nm).

In general, low frequency noise is referred to as noise generated at frequencies of less than or equal to 100 kHz. Low frequency noise may be generally classified into flicker noise and random telegraph signal (RTS) noise. Generally, noise of the image sensor generated by the pixels of the pixel array is time-variant noise due to RTS noise of the drive transistor.

RTS noise is inversely proportional to the capacitance across the gate dielectric layer of the drive transistor, and the capacitance across the gate dielectric layer is inversely proportional to the thickness of the gate dielectric layer. Thus, RTS noise may be proportional to the thickness of the gate dielectric layer of the drive transistor.

The thickness T3 of the third gate dielectric layer 331-3 of the drive transistor 240 of each of the pixel units 410 of the pixel array 120 may be less than the thickness T1 of the first gate dielectric layer 331-1 of the transfer transistor 220, the thickness T2 of the second gate dielectric layer 331-2 of the reset transistor 230, and the thickness T4 of the fourth gate dielectric layer 331-4 of the select transistor 250. Thereby, the RTS noise generated at the drive transistor 240 and time-variant noise in the pixel array may be decreased.

Figure 8:
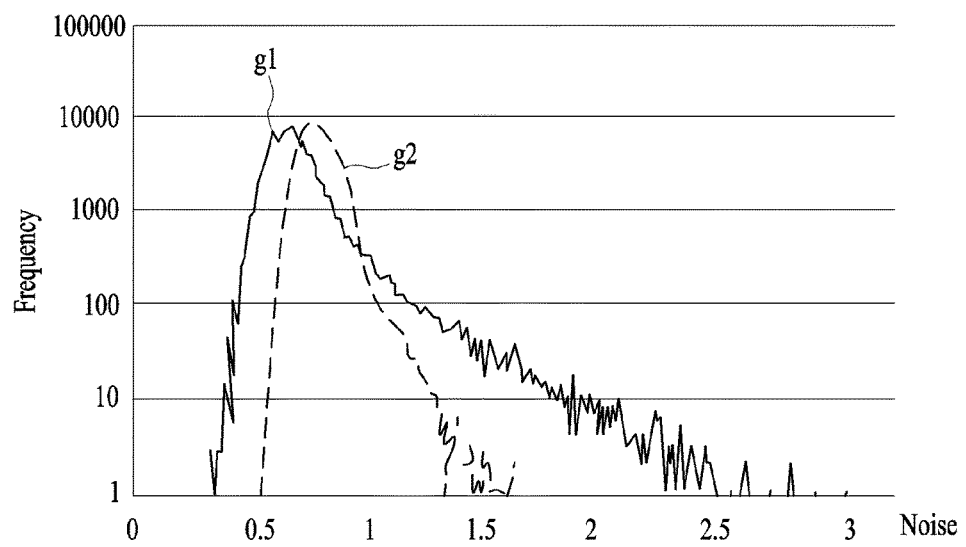
FIG. 8 is a noise histogram of an exemplary drive transistor.

FIG. 8 is a noise histogram of the drive transistor. Referring to FIG. 8, g1 illustrates a noise histogram of a drive transistor including a gate dielectric layer having a thickness identical to thicknesses of gate dielectric layers of a transfer transistor, a reset transistor, and a select transistor (hereinafter, referred to as "case 1"). For example, in case 1, the thickness of the gate dielectric layer of the drive transistor is greater than or equal to 6 nm.

Referring to FIG. 8, g2 illustrates a noise histogram of a drive transistor, according to one embodiment, including a gate dielectric layer having a thickness less than the thicknesses of gate dielectric layers of a transfer transistor, a reset transistor, and a select transistor (hereinafter, referred to as "case 2"). For example, in case 2, the thickness of the gate dielectric layer of the drive transistor is less than 6 nm.

Referring to FIG. 8, a tail of the histogram of g2 is shorter than that of g1. Namely, noise in case 2 is less than noise in case 1 in a low frequency region. Upon comparison of g1 and g2 using a Gaussian histogram, the efficiency of the image sensor according to present invention is higher. As described above, RTS noise of the drive transistor is decreased. Thus, the number and/or proportion of blinking pixels in an image and the time-variant noise in the image sensor may decrease.

Figure 5:
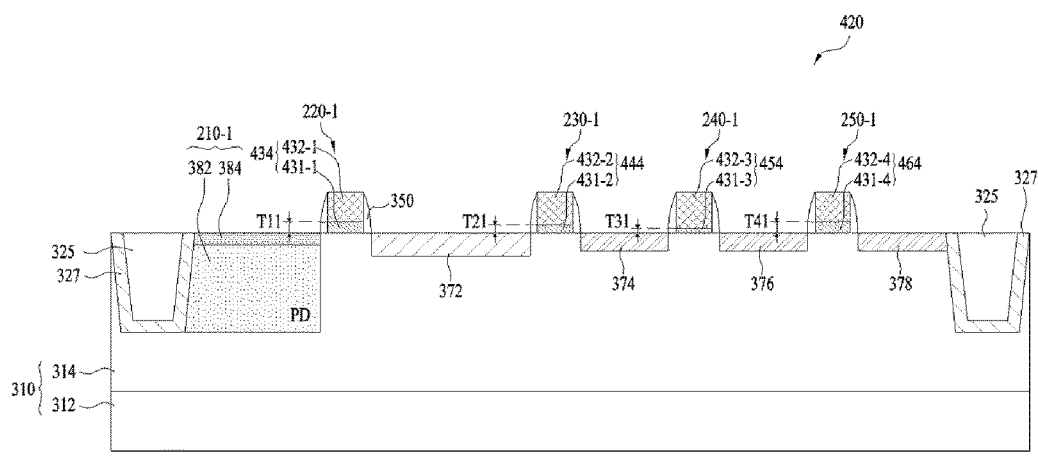
FIG. 5 is a cross-sectional view illustrating the exemplary pixel unit illustrated in FIG. 2, taken along the line A-B, according to one or more other embodiments of the present invention.

FIG. 5 is a cross-sectional view illustrating the pixel unit illustrated in FIG. 2, taken along line A-B according to one or more other embodiments of the present invention. Reference numerals referred to in the above description of FIG. 4 refer to the same constituents in FIG. 5. The description of the same constituents herein below may be simplified or omitted.

Referring to FIG. 5, thicknesses of the first, second, third and fourth gate dielectric layers 431-1 to 431-4 of a pixel unit 420 may be different from the thicknesses described in FIG. 4.

FIG. 5 illustrates the first, second, third and fourth gate dielectric layers 431-1 to 431-4 and the first, second, third and fourth gate electrodes 332-1 to 332-4 of the first, second, third and fourth transistors 220-1 to 250-1 in the pixel unit 420.

In FIG. 4, the thickness of the first gate dielectric layer 331-1 of the transfer transistor 220, the thickness of the second gate dielectric layer 331-2 of the reset transistor 230, and the thickness of the fourth gate dielectric layer 331-4 of the select transistor 250 are identical to one another. However, in FIG. 5, at least one of the above thicknesses may be different.

In FIG. 5, the thickness T31 of the third gate dielectric layer 431-3 of the drive transistor 240-1 may be less than a thickness T11 of the first gate dielectric layer 431-1 of the transfer transistor 220-1, a thickness T21 of the second gate dielectric layer 431-2 of the reset transistor 230-1, and a thickness T41 of the fourth gate dielectric layer 431-4 of the select transistor 250-1 (e.g., T31<T11, T21, and T41).

Furthermore, the thickness T21 of the second gate dielectric layer 431-2 of the reset transistor 230-1 may be less than the thickness T11 of the first gate dielectric layer 431-1 of the transfer transistor 220-1 and the thickness T41 of the fourth gate dielectric layer 431-4 of the select transistor 250-1 (e.g., T21<T11 and T41).

For example, T31 may be identical or substantially similar to T3 of FIG. 4, and T21 may be greater than or equal to 6 nm and less than 8 nm (e.g., 6 nm≤T21<8 nm). In addition, T11 and T41 may be greater than or equal to 8 nm and less than or equal to 10 nm (e.g., 8 nm≤T11 and T41≤10 nm).

Since the thickness T21 of the second gate dielectric layer 431-2 may be less than the thickness T11 of the first gate dielectric layer 431-1 and thickness T41 of the fourth gate dielectric layer 431-4, the RTS noise of the reset transistor 230-1 and the time-variant noise of the pixel array may be decreased. Thereby, noise characteristics of the image sensor may be improved.

In other embodiments, the thickness of the first gate dielectric layer of the transfer transistor may be less than the thickness of the second gate dielectric layer of the reset transistor and the thickness of the fourth gate dielectric layer of the select transistor.

In one or more further embodiments, the thickness of the fourth gate dielectric layer of the select transistor may be less than the thickness of the first gate dielectric layer of the transfer transistor and the thickness of the second gate dielectric layer of the reset transistor.

Figure 6:
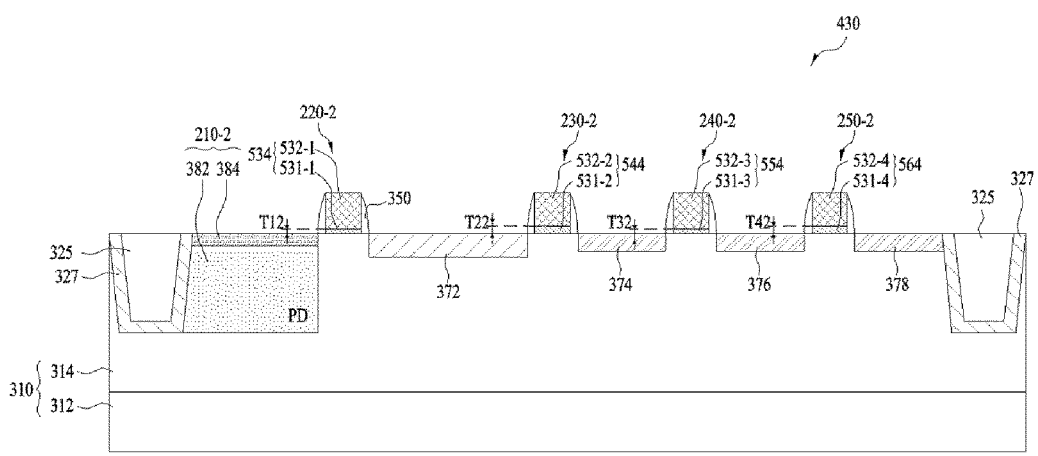
FIG. 6 is a cross-sectional view illustrating the exemplary pixel unit illustrated in FIG. 2, taken along the line A-B, according to one or more further embodiments of the present invention.

FIG. 6 is a cross-sectional view illustrating the exemplary pixel unit illustrated in FIG. 2, taken along line A-B, according to other embodiments of the present invention. Reference numerals referred to in the above-described FIG. 4 refer to the same constituents in FIG. 6 As a result, the description of the same constituents may be simplified or omitted.

FIG. 6 illustrates the first, second, third and fourth gate dielectric layers 531-1 to 531-4 and the first, second, third and fourth gate electrodes 532-1 to 532-4 of the first, second, third and fourth transistor 220-2 to 250-2 included in the pixel unit 430. At least one of a thickness T12 of the first gate dielectric layer 531-1 of the transfer transistor 220-2, a thickness T22 of the second gate dielectric layer 531-2 of the reset transistor 230-2, and a thickness T42 of the fourth gate dielectric layer 531-4 of the select transistor 250-2 may be identical or substantially similar to a thickness T32 of the third gate dielectric layer 531-3 of the drive transistor 240-2.

In addition, at least one of the thicknesses of the first gate dielectric layer 531-1 of the transfer transistor 220-2, the second gate dielectric layer 531-2 of the reset transistor 230-2, and the fourth gate dielectric layer 531-4 of the select transistor 250-2 may be identical to the thickness T32 of the third gate dielectric layer 531-3 of the drive transistor 240-2. Furthermore, the thickness T32 of the third gate dielectric layer 531-3 of the drive transistor 240-2 may be less than one of the other thicknesses of the first gate dielectric layer 531-1 of the transfer transistor 220-2, the second gate dielectric layer 531-2 of the reset transistor 230-2, and the fourth gate dielectric layer 531-4 of the select transistor 250-2.

For example, the thickness T12 of the first gate dielectric layer 531-1 may be identical or substantially similar to the thickness T32 of the third gate dielectric layer 531-3. In addition, the thickness T32 of the third gate dielectric layer 531-3 may be less than each of the thicknesses T22 and T42 of the second gate dielectric layer 531-2 and the fourth gate dielectric layer 531-4. For example, T32 may be identical or substantially similar to T3 of FIG. 4.

In addition, T12 may be greater than or equal to 1 nm and less than 6 nm (e.g., 1 nm≤T12<6 nm). In another embodiment, T12 may be greater than or equal to 3 nm and less than or equal to 4 nm (e.g., 3 nm≤T12≤4 nm). In a further embodiment, T12 may be greater than or equal to 1 nm and less than or equal to 3 nm (e.g., 1 nm≤T12≤3 nm).

For example, T22 and T42 may be greater than or equal to 6 nm and less than or equal to 10 nm (e.g., 6 nm≤T22 and T42≤10 nm).

As described above, the thickness of the drive transistor of the pixel unit of the pixel array 120 may be less than the thickness of at least one of the other transistors, according to embodiments of the present invention. As a result, RTS noise and time-variant noise may be decreased. Thereby, the number and/or proportion of blinking pixels in an image may be decreased and the time-variant noise may decrease.

The image sensor 100 of FIG. 1 may be divided into a sensing area SA, a digital area DA, and an analog area AA.

The sensing area SA may include the pixel array 120. The digital area DA may include the controller 110, a row driver, and the data storage unit 140. The analog area AA may include the analog-digital conversion block 130.

Figure 7:
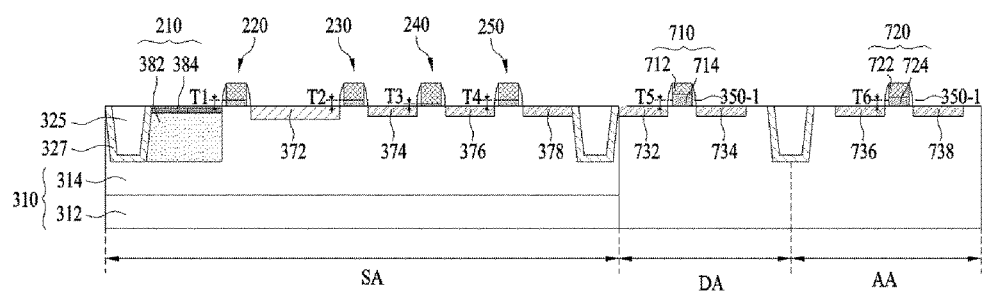
FIG. 7 is a cross-sectional view illustrating an exemplary sensing area, an exemplary analog area, and an exemplary digital area according to one or more embodiments of the present invention.

FIG. 7 is a cross-sectional view illustrating the sensing area, the analog area, and the digital area, according to one or more embodiments of the present invention.

Referring to FIG. 7, the pixel units P11 to Pnm of the pixel array 120 may be in at the sensing area SA. A cross-sectional view of the pixel unit may be identical or substantially similar to FIG. 4. Thus, the description of the pixel unit in FIG. 7 may be identical or substantially similar to that in the above description of FIG. 4.

Referring to FIG. 7, at least one digital gate 710 (hereinafter, referred to as "a fifth gate") may be on or over the semiconductor substrate 110 in the digital area DA. Furthermore, at least one analog gate 720 (hereinafter, referred to as "a sixth gate") may be on or over the semiconductor substrate 110 in the analog area AA. Spacers 350-1 may be on the sidewalls of the fifth and sixth gates 710 and 720, respectively.

The fifth gate 710 may be a gate of each of the devices in the digital area DA. For example, the fifth gate 710 may be a gate of each transistor included in the timing gate controller, the driver, the input/output unit and the data storage unit 140.

The fifth gate 710 may include a fifth gate electrode 712 and a fifth gate dielectric layer 714. The sixth gate 720 may include a sixth gate electrode 722 and a sixth gate dielectric layer 724.

The sixth gate 720 may be a gate of the devices constituting the analog-digital conversion block 130. For example, the sixth gate 720 may be a gate of each of the transistors in the CDS processor of the analog-digital conversion block 130 and the analog-digital converter.

A first impurity region 732 (e.g., a source region) may be in one region of the semiconductor substrate 110 at one side of the fifth gate 710. A second impurity region 734 (e.g., a drain region) may be in another region of the semiconductor substrate 110 at an opposite side of the fifth gate 710.

Furthermore, a third impurity region 736 (e.g., a source region, or alternatively, an emitter or collector region) may be in one region of the semiconductor substrate 110 at one side of the sixth gate 720. A fourth impurity region 738 (e.g., a drain region, or alternatively, the other of the emitter and collector) may be in another region of the semiconductor substrate 110 at an opposite side of the sixth gate 720.

Each of the thicknesses of the first, second, third and fourth gate dielectric layers 331-1 to 331-4 of the pixel unit 410 illustrated in FIG. 4 is less than a thickness of the fifth gate dielectric layer 714 and a thickness of the sixth gate dielectric layer 724.

Each of the thicknesses of the first, second, third and fourth gate dielectric layers 331-1 to 331-4 of the pixel unit 410 is less than each of thicknesses of the fifth and sixth gate dielectric layers 714 and 724. As a result, voltages provided to the first, second, third and fourth gate electrodes 332-1 to 332-4 of the first, second, third and fourth transistors 220 to 250 of the pixel unit 410 may be decreased, thereby decreasing power consumption according to embodiments of the present invention.

In addition, each of the thicknesses of the first, second, third and fourth gate dielectric layers 331-1 to 331-4 of the pixel unit 410 is less than each of thicknesses of the fifth and sixth gate dielectric layers 714 and 724. As a result, the efficiency of charge transfer to the floating diffusion region FD in the photodiode of the transfer transistor 220 may increase, and the threshold voltages of the reset transistor 230, the drive transistor 240, and the select transistor 250 may be decreased, thereby increasing a swing range of the pixel output.

According to embodiments of the present invention, since the thicknesses of the gate dielectric layers of the transistors in the pixel unit are relatively thin, and although voltages supplied to the gate electrodes of the transistors in the pixel unit may decrease, a decrease in the charge transfer efficiency of the pixel unit may be prevented.

Furthermore, according to embodiments of the present invention, since the thicknesses of the gate dielectric layers of the transistors in the pixel unit are relatively thin, any decrease in the swing range of the pixel output due to an increase in transistor threshold voltages may also be prevented.

FIG. 7 illustrates the exemplary pixel unit illustrated in FIG. 4, but embodiments are not limited thereto. In other embodiments, the pixel unit of the sensing area SA of FIG. 7 may be the same or a substantially similar pixel unit as those illustrated in FIGS. 5 and 6. Thus, the description of FIGS. 5 and 6 may also or alternatively be applied.

An exemplary method of making the present image sensor may include forming the image sensor by a largely conventional process, with the following changes.

The exemplary method may include forming the first, second, third and fourth gate dielectric layers having different thicknesses as described above. For example, gate dielectric layers having first and second different thicknesses may be formed at different times on the exposed upper surface of the substrate. First, areas of the image sensor in which the transistors having second gate dielectric thickness will be formed are masked off (e.g., using a photoresist). The gate dielectric layer(s) having a first thickness (e.g., from 6 nm to 10 nm) in the unmasked area is/are grown. Next, areas of the image sensor in which the transistors having the first gate dielectric thickness will be formed are masked off (e.g., using a photoresist). The gate dielectric layer(s) having the second thickness (e.g., from 1 nm to <6 nm) in the unmasked area is/are grown. The gate dielectric layers having first and second different thicknesses may be formed in the reverse order (i.e., second thickness first, followed by first thickness).

In examples where a gate dielectric layer having a third thickness is formed, the gate dielectric layers having the second and third thicknesses may be masked off, then the gate dielectric layer(s) having the first thickness (e.g., from 6 nm to 10 nm) is/are grown. Then, the gate dielectric layers having the first and third thicknesses may be masked off, and the gate dielectric layer(s) having the second thickness (e.g., from 3 nm to 4 nm) is/are grown. Subsequently, the gate dielectric layers having the first and second thicknesses may be masked off, and the gate dielectric layer(s) having the third thickness (e.g., from 1 nm to 3 nm) is/are grown. The gate dielectric layers having first, second and third different thicknesses may be formed in substantially any order (i.e., second thickness first, followed by first thickness, then third thickness).

Subsequently, the gate electrode layers are formed on an upper surface of the gate dielectric layers, and the gate electrode and gate dielectric layers are conventionally patterned. Next, one or more spacer dielectric layers are deposited on the substrate and on the sides of the gates, and the spacers are formed by isotropic (directional) etching. Implant regions may be conventionally formed in the substrate as shown in the figures.

As is apparent from the above description, the present invention advantageously decreases the number and/or proportion of blinking pixels, the time-variant noise in the pixels, and power consumption.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An image sensor comprising:
a pixel array comprising a plurality of pixel units;
a controller configured to drive the pixel array; and
an analog-digital conversion block configured to convert a sensing signal output from the pixel array into a digital signal, wherein each of the pixel units comprises:
a photodiode in a semiconductor substrate; and
a transfer transistor, a reset transistor, a drive transistor, and a select transistor on the semiconductor substrate spaced from one another, wherein
the transfer transistor comprises a first gate electrode and a first gate dielectric layer,
the reset transistor comprises a second gate electrode and a second gate dielectric layer,
the drive transistor comprises a third gate electrode and a third gate dielectric layer,
the select transistor comprises a fourth gate electrode and a fourth gate dielectric layer, and each of the first, second, third, and fourth gate dielectric layers has a thickness, the thickness of the third gate dielectric layer is less than the thickness the first gate dielectric layer, the second gate dielectric layer or the fourth gate dielectric layer, and the thickness of the second gate dielectric layer is less than the thickness of the first gate dielectric layer and the thickness of the fourth gate dielectric layer.

2. The image sensor according to claim 1, wherein the thickness of the third gate dielectric layer is less than the thickness of the first gate dielectric layer, the thickness of the second gate dielectric layer, and the thickness of the fourth gate dielectric layer.

3. The image sensor according to claim 1, wherein the thickness of the third gate dielectric layer is equal to a thickness of the first gate dielectric layer, the second gate dielectric layer, or the fourth gate dielectric layer.

4. The image sensor according to claim 1, wherein the thickness of one of the first gate dielectric layer, the second gate dielectric layer, and the fourth gate dielectric layer is less than the thicknesses of the others of the first gate dielectric layer, the second gate dielectric layer, and the fourth gate dielectric layer.

5. The image sensor according to claim 1, wherein the thickness of the first gate dielectric layer and the thickness of the fourth gate dielectric layer are identical to each other.

6. The image sensor according to claim 1, wherein the thickness of the first gate dielectric layer is identical to the thickness of the third gate dielectric layer.

7. The image sensor according to claim 1, wherein (i) the first gate dielectric layer is between the semiconductor substrate and the first gate electrode, (ii) the second gate dielectric layer is between the semiconductor substrate and the second gate electrode, (iii) the third gate dielectric layer is between the semiconductor substrate and the third gate electrode, and (iv) the fourth gate dielectric layer is between the semiconductor substrate and the fourth gate electrode.

8. The image sensor according to claim 1, wherein the first, second, third and fourth gate dielectric layers are on the semiconductor substrate spaced from one other.

9. The image sensor according to claim 1, wherein:
the thickness of the third gate dielectric layer is greater than or equal to 1 nm and less than 6 nm, and
each of the thicknesses of the first gate dielectric layer, the second gate dielectric layer, and the fourth gate dielectric layer is greater than or equal to 6 nm and less than or equal to 10 nm.

10. An image sensor comprising:
a sensing area comprising a pixel array including a plurality of pixel units;
a digital area configured to control the sensing area; and
an analog area configured to convert a signal from the sensing area into a digital signal, wherein
each of the pixel units comprises a photodiode, a transfer transistor, a reset transistor, a drive transistor, and a select transistor;
each of the transfer transistor, the reset transistor, the drive transistor, and the select transistor includes a gate dielectric layer having a thickness, and the thickness of at least one of the gate dielectric layers of the transfer transistor, the reset transistor, the drive transistor, and the select transistor is different from the thickness of at least one gate dielectric layer of the others of the transfer transistor, the reset transistor, the drive transistor, and the select transistor;
the digital area comprises at least one first transistor; and
the analog area comprises at least one second transistor;
the first and second transistors each have a gate dielectric layer having a thickness; and
each of the thicknesses of the gate dielectric layers of the transfer transistor, the reset transistor, the drive transistor, and the select transistor is less than the thicknesses of the gate dielectric layers of the first and second transistors.

11. An image sensor comprising:
a pixel array comprising a plurality of pixel units;
a controller configured to drive the pixel array; and
an analog-digital conversion block configured to convert a sensing signal output from the pixel array into a digital signal, wherein each of the pixel units comprises:
a photodiode in a semiconductor substrate; and
a transfer transistor, a reset transistor, a drive transistor, and a select transistor on the semiconductor substrate spaced from one another, wherein
the transfer transistor comprises a first gate electrode and a first gate dielectric layer,
the reset transistor comprises a second electrode and a second gate dielectric layer,
the drive transistor comprises a third gate electrode and a third gate dielectric layer,
the select transistor comprises a fourth gate electrode and a fourth gate dielectric layer,
each of the first, second, third, and fourth gate dielectric layers has a thickness, and
the thickness of at least one of the first, second, third and fourth gate dielectric layers is different from thicknesses at least one of the other gate dielectric layers, and the thickness of the first gate dielectric layer is identical to the thickness of the third dielectric layer.

* * * * *